United States Patent
Hong et al.

(10) Patent No.: US 12,512,380 B2
(45) Date of Patent: Dec. 30, 2025

(54) SEMICONDUCTOR PACKAGES INCLUDING A PACKAGE BODY WITH GROOVES FORMED THEREIN

(71) Applicant: Infineon Technologies AG, Neubiberg (DE)

(72) Inventors: Chii Shang Hong, Bukit Katil (MY); Li Fong Chong, Alor Gajah (MY); Yee Beng Daryl Yeow, Batu Berendam (MY); Edward Fürgut, Dasing (DE); Mei Fen Hiew, Melaka (MY); Azlina Kassim, Taman Bukit Cheng (MY); Ralf Otremba, Kaufbeuren (DE); Bernd Schmoelzer, Radenthein (AT); Joon Shyan Tan, Seremban (MY); Lee Shuang Wang, Bukit Baru (MY)

(73) Assignee: Infineon Technologies AG, Neubiberg (DE)

( * ) Notice: Subject to any disclaimer, the term of this patent is extended or adjusted under 35 U.S.C. 154(b) by 427 days.

(21) Appl. No.: 18/119,118

(22) Filed: Mar. 8, 2023

(65) Prior Publication Data
US 2023/0298956 A1 Sep. 21, 2023

(30) Foreign Application Priority Data
Mar. 16, 2022 (DE) .................. 10 2022 106 078.0

(51) Int. Cl.
*H01L 23/31* (2006.01)
*H01L 21/56* (2006.01)
(Continued)

(52) U.S. Cl.
CPC .......... *H01L 23/315* (2013.01); *H01L 21/565* (2013.01); *H01L 23/3121* (2013.01); *H01L 23/3135* (2013.01); *H01L 23/49503* (2013.01); *H01L 23/49558* (2013.01); *H01L 23/49562* (2013.01); *H01L 24/40* (2013.01); *H01L 24/48* (2013.01); *H01L 2224/40257* (2013.01);
(Continued)

(58) Field of Classification Search
CPC ............................... H01L 24/40; H01L 24/48
See application file for complete search history.

(56) References Cited

U.S. PATENT DOCUMENTS

| | | |
|---|---|---|
| 2015/0102479 A1 | 4/2015 | Fuergut et al. |
| 2018/0076909 A1* | 3/2018 | Latham .................. H04B 17/17 |

(Continued)

*Primary Examiner* — Walter H Swanson
(74) *Attorney, Agent, or Firm* — Dicke, Billig & Czaja, PLLC

(57) ABSTRACT

A semiconductor package is disclosed. In one example, the semiconductor package includes a package body. A first diepad is at least partially uncovered by the package body at the first main surface. A second diepad is at least partially uncovered by the package body at the first main surface. A first semiconductor chip is arranged on the first diepad. A second semiconductor chip is arranged on the second diepad. The semiconductor package further includes at least one lead protruding out of the package body at the side surface. A first groove is formed in the first main surface, wherein the first groove is arranged between the first diepad and the second diepad, and a second groove is formed in the first main surface, wherein the second groove is arranged between the at least one lead and at least one of the first diepad and the second diepad.

20 Claims, 5 Drawing Sheets

(51) Int. Cl.
*H01L 23/00* (2006.01)
*H01L 23/495* (2006.01)

(52) U.S. Cl.
CPC ............... *H01L 2224/48257* (2013.01); *H01L 2924/1203* (2013.01); *H01L 2924/13091* (2013.01); *H01L 2924/1811* (2013.01); *H01L 2924/1815* (2013.01); *H01L 2924/182* (2013.01)

(56) References Cited

U.S. PATENT DOCUMENTS

2019/0378785 A1 12/2019 Muto et al.
2020/0273802 A1 8/2020 Otremba
2020/0343166 A1 10/2020 Bonifacio et al.

* cited by examiner

SEMICONDUCTOR PACKAGES INCLUDING A PACKAGE BODY WITH GROOVES FORMED THEREIN

CROSS-REFERENCE TO RELATED APPLICATION

This Utility Patent Application claims priority to German Patent Application No. 10 2022 106 078.0 filed Mar. 16, 2022, which is incorporated herein by reference.

TECHNICAL FIELD

The present disclosure relates to semiconductor packages including a package body with grooves formed therein. In addition, the present disclosure relates to methods for manufacturing such semiconductor packages.

BACKGROUND

Various semiconductor devices may be operated based on high voltages. Such semiconductor devices as well as applications and equipments in which they are used may need to comply with electric isolation requirements defined by associated safety standards. One or multiple components of a semiconductor device may be encapsulated in a package body such that the semiconductor device may also be referred to as a semiconductor package. In order to guarantee safe operation of a semiconductor package, one or multiple minimum creepage distances between conductive parts protruding out of the package body may need to be fulfilled. Manufacturers and developers of semiconductor packages are constantly striving to improve their products and methods for manufacturing thereof. It may thus be desirable to develop semiconductor packages fulfilling all safety conditions required by associated safety standards. In particular, it may be desirable to protect the semiconductor packages from harmful creepage along surfaces of the package body.

SUMMARY

An aspect of the present disclosure relates to a semiconductor package. The semiconductor package comprises a package body, comprising a first main surface, a second main surface opposite to the first main surface, and a side surface extending between the first and second main surfaces. The semiconductor package further comprises a first diepad encapsulated in the package body, wherein the first diepad is at least partially uncovered by the package body at the first main surface. The semiconductor package further comprises a second diepad encapsulated in the package body, wherein the second diepad is at least partially uncovered by the package body at the first main surface. The semiconductor package further comprises a first semiconductor chip encapsulated in the package body and arranged on the first diepad. The semiconductor package further comprises a second semiconductor chip encapsulated in the package body and arranged on the second diepad. The semiconductor package further comprises at least one lead encapsulated in the package body and protruding out of the package body at the side surface. The semiconductor package further comprises a first groove formed in the first main surface, wherein the first groove is arranged between the first diepad and the second diepad. The semiconductor package further comprises a second groove formed in the first main surface, wherein the second groove is arranged between the at least one lead and at least one of the first diepad and the second diepad.

An aspect of the present disclosure relates to a semiconductor package. The semiconductor package comprises a package body, comprising a first main surface, a second main surface opposite to the first main surface, and a side surface extending between the first and second main surfaces. The semiconductor package further comprises a first diepad encapsulated in the package body, wherein the first diepad is at least partially uncovered by the package body at the first main surface. The semiconductor package further comprises a second diepad encapsulated in the package body, wherein the second diepad is at least partially uncovered by the package body at the first main surface. The semiconductor package further comprises a first semiconductor chip encapsulated in the package body and arranged on the first diepad. The semiconductor package further comprises a second semiconductor chip encapsulated in the package body and arranged on the second diepad. The semiconductor package further comprises a first groove formed in the first main surface, wherein the first groove is arranged between the first diepad and the second diepad. The semiconductor package further comprises an electric connection element encapsulated in the package body and extending over the first groove between the first diepad and the second diepad, wherein a depth of the first groove is smaller than or equal to at least one of a thickness of the first diepad and a thickness of the second diepad.

An aspect of the present disclosure relates to a method for manufacturing a semiconductor package. The method comprises providing a first diepad, a second diepad and at least one lead. The method further comprises arranging a first semiconductor chip on the first diepad. The method further comprises arranging a second semiconductor chip on the second diepad. The method further comprises encapsulating the first diepad, the second diepad, the first semiconductor chip, the second semiconductor chip and the at least one lead in a package body, wherein the package body comprises a first main surface, a second main surface opposite to the first main surface, and a side surface extending between the two main surfaces, wherein: the first diepad is at least partially uncovered by the package body at the first main surface, the second diepad is at least partially uncovered by the package body at the first main surface, and the at least one lead protrudes out of the package body at the side surface. The method further comprises forming a first groove in the first main surface, wherein the first groove is arranged between the first diepad and the second diepad. The method further comprises forming a second groove in the first main surface, wherein the second groove is arranged between the at least one lead and at least one of the first diepad and the second diepad.

BRIEF DESCRIPTION OF THE DRAWINGS

The accompanying drawings are included to provide a further understanding of aspects. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense.

Figure 1A:
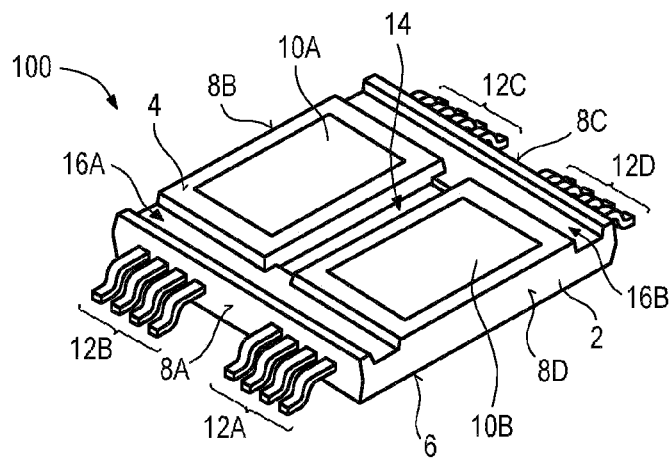
FIGS. 1A to 1D schematically illustrate a perspective view, a top view, a first cross-sectional side view and a second cross-sectional side view of a semiconductor package in accordance with the disclosure.
Figure 1B:
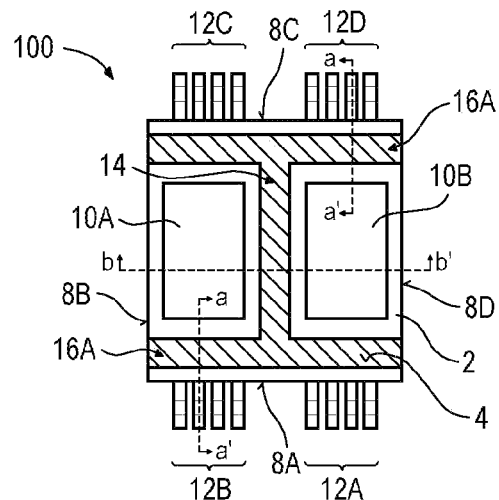
Figure 1C:
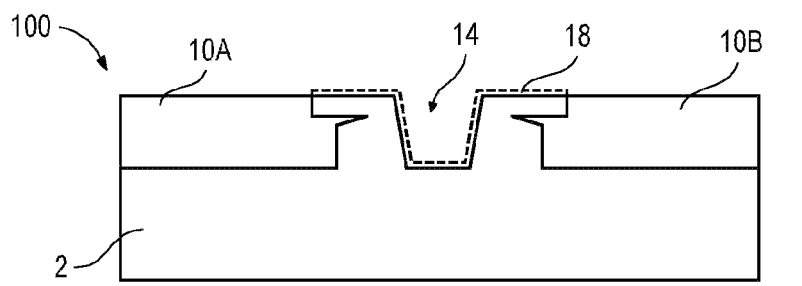
Figure 1D:
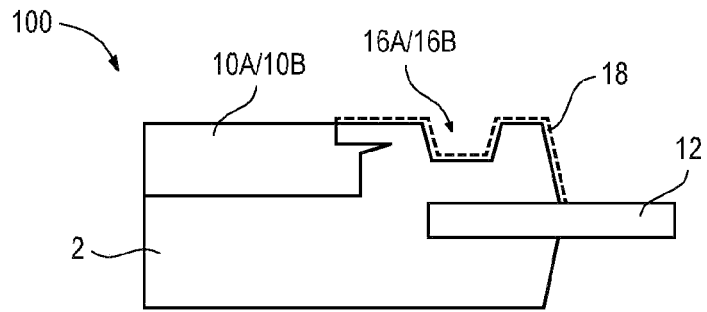

FIGS. 1A to 1D schematically illustrate a semiconductor package 100 in accordance with the disclosure. FIGS. 1A and 1B illustrate a perspective view and a top view of the semiconductor package 100, respectively. In addition, FIG. 1C illustrates a first cross-sectional side view of the semiconductor package 100 along a dashed line b-b' indicated in FIG. 1B, while FIG. 1D illustrates a second cross-sectional side view of the semiconductor package 100 along a dashed line a-a' indicated in FIG. 1B.

The semiconductor package 100 may include a package body 2 with a first main surface 4, a second main surface 6 opposite to the first main surface 4 and multiple side surfaces 8A to 8D extending between the first and second main surfaces 4 and 6. In the illustrated example, the package body 2 may include an exemplary number of four side surfaces 8A to 8D. A first diepad 10A and a second diepad 10B may be at least partly encapsulated in the package body 2. Each of the first diepad 10A and the second diepad 10B may be uncovered by the material of the package body 2 at the first main surface 4.

The semiconductor package 100 may further include one or multiple semiconductor chips which may be at least partly encapsulated in the package body 2. In particular, the semiconductor package 100 may include a first semiconductor chip arranged on the first diepad 10A and a second semiconductor chip arranged on the second diepad 10B. In the illustrated example of FIG. 1A to 1D, each of the semiconductor chips may be arranged on the bottom surface of the respective diepad and may be covered by the package body 2. Accordingly, in FIG. 1A to 1D the semiconductor chips may not be visible to a viewer.

The semiconductor package 100 may further include multiple leads (or pins) 12 which may be at least partly encapsulated in the package body 2. The leads 12 may protrude out of the package body 2 at one or multiple of the side surfaces 8A to 8D of the package body 2. In the example of FIG. 1A to 1D, the semiconductor package 100 may include four sets 12A to 12D of leads, wherein each set may exemplarily include a number of four leads. In further examples, the number of leads per set may differ. The leads 12 and the first and second diepads 10A, 10B may be part of a leadframe. In the illustrated example, the leads 12 may be bent downwards such that the semiconductor package 100 may be configured to be mounted on a printed circuit board (not illustrated) based on a surface mount technique. The sets of leads 12B and 12C may be arranged at opposite sides of the first diepad 10A. In a similar fashion, the sets of leads 12A and 12D may be arranged at opposite sides of the second diepad 10B.

The semiconductor package 100 may further include a first groove 14 formed in the first main surface 4 of the package body 2, wherein the first groove 14 may be arranged between the first diepad 10A and the second diepad 10B. In the example of FIG. 1A to 1D, the first groove 14 may substantially extend in the y-direction. In addition, the semiconductor package 100 may include a second groove 16A and a third groove 16B formed in the first main surface 4. These second and third grooves 16A and 16B may be arranged between leads 12 and at least one of the first diepad 10A and the second diepad 10B. In the example of FIG. 1A to 1D, the second and third grooves 16A and 16B may substantially extend in the x-direction. The second groove 16A may be arranged between the set of leads 12A and the second diepad 10B as well as between the set of leads 12B and the first diepad 10A. In a similar fashion, the third groove 16B may be arranged between the set of leads 12C and the first diepad 10A as well as between the set of leads 12D and the second diepad 10B.

As discussed above, the semiconductor package 100 may include one or multiple semiconductor chips. In this regard, it is to be noted that throughout this description, the terms "chip", "semiconductor chip", "die", "semiconductor die" may be interchangeably used. In general, semiconductor chips as described herein may be manufactured from an elemental semiconductor material (e.g. Si) or from a wide band gap semiconductor material or a compound semiconductor material (e.g. SiC, GaN, SiGe, GaAs). In particular, each of the semiconductor chips arranged on the first diepad 10A and the second diepad 10B may include or may correspond to a power semiconductor component and may thus be referred to as power semiconductor chip. Here, the term "power semiconductor chip" may refer to a semiconductor chip providing at least one of high voltage blocking or high current-carrying capabilities. A power semiconductor chip may be configured for high currents having a maximum current value of a few Amperes, such as e.g. 10 A, or a maximum current value of up to or exceeding 100 A. Similarly, voltages associated with such current values may have values of a few Volts to a few tens or hundreds or even thousands of Volts.

Power semiconductor chips may be used in any kind of power application like e.g. MOSFETs (Metal Oxide Semiconductor Field Effect Transistors), half bridge circuits, power modules including a gate driver, etc. For example, power chips may include or may be part of a power device like e.g. a power MOSFET, an LV (low voltage) power MOSFET, a power IGBT (Insulated Gate Bipolar Transistor), a power diode, a superjunction power MOSFET, etc. In the present case, the power semiconductor chips may particularly be used in half bridge configurations and/or boost configurations, such as e.g. buck-boost-converters or boost converters. For example, such configurations may include a SiC MOSFET and/or a SiC diode. The configurations may be used for industrial grade products applied in one or more of integrated servo motor inverters or PFC (Power Factor Correction) Boost stages, for example. Addressed applications may include automotive applications, industrial drive applications, EV (Electric Vehicle) charging, etc. Exemplary circuits configured to be implemented in a semiconductor package in accordance with the present disclosure are shown and described in connection with FIGS. 12 and 13.

The package body 2 may be manufactured from a material including at least one of a mold compound, an epoxy, a filled epoxy, a glass fiber filled epoxy, an imide, a thermoplast, a thermoset polymer, a polymer blend, a laminate, etc. Various techniques may be used for encapsulating the components of the arrangement in the package body 2, for example at least one of compression molding, injection molding, powder molding, liquid molding, map molding, laminating, etc. In a non-limiting example, a mold compound forming the package body 2 may have a CTI (Comparative Tracking Index) value of greater than about 600 V. For example, the semiconductor package of FIG. 1A to 1D may correspond to be a QDPAK (Quadruple DPAK)-semiconductor package. As will turn out later on semiconductor packages in accordance with the disclosure may provide an increased creep current resistance and a robust encapsulant.

The package body 2 may form a housing (or package) of the encapsulated components and may thus be configured to protect the encapsulated components of the semiconductor package 100 against external influences, such as e.g. moisture or mechanical impact. As discussed above, the first and second diepads 10A and 10B as well as the leads 12A to 12D may be at least partly uncovered by the material of the package body 2. This way, semiconductor chips located inside the semiconductor package 100 may be electrically accessible from outside of the package body 2 via the first and second diepads 10A, 10B and/or the leads 12A to 12D. Exemplary electric connections between the semiconductor chips and the diepads 10A, 10B as well as between the semiconductor chips and the leads 12 are shown and discussed in connection with FIGS. 12 and 13.

The first diepad 10A and the second diepad 10B may be configured to operate at different electric potentials. In one example, the first and second diepads 10A and 10B may correspond to drain contacts of different power transistors (see e.g. FIG. 12) and may thus lie on different electric potentials during an operation of the semiconductor package 100. In order to avoid a short between the exposed surfaces of the first and second diepads 10A and 10B, a condition of a minimum creepage distance between the first and second diepads 10A and 10B may need to be fulfilled. In general, a creepage distance may be defined as the shortest distance along the surface of a solid insulating material between two conductive parts. A minimum creepage distance may e.g. depend on at least one of material properties, effective voltages values, pollution degrees, etc.

In the example of FIG. 1A to 1D, a creepage distance between the first diepad 10A and the second diepad 10B may extend along a surface of the package body 2. An exemplary path of such creepage distance 18 is exemplarily indicated by a dashed line in the side view of FIG. 1C. The first groove 14 may be configured to increase the creepage distance 18 along the package body 2 between the first diepad 10A and the second diepad 10B. That is, by providing the first groove 14 in the package body 2, a risk of a short between the first and second diepads 10A and 10B and thus a malfunction of the semiconductor package 100 may be avoided or at least reduced.

In a similar fashion, one or multiple of the leads 12 and at least one of the first diepad 10A and the second diepad 10B may be configured to operate at different electric potentials. For example, one or multiple of the leads 12D may include a gate contact and/or a source contact of a power transistor, while the second diepad 10B may correspond to a drain contact of the power transistor (see e.g. FIG. 12). An exemplary creepage distance 18 between one of the leads 12 and one of the first and second diepads 10A, 10B may extend along a path which is exemplarily indicated by a dashed line in the side view of FIG. 1D. The second groove 16A and the third groove 16B may be configured to increase a creepage distance along the package body 2 between the lead 12 and the first and second diepads 10A, 10B as illustrated in FIG. 1D and may thus reduce the risk of a short.

When viewed in the z-direction (see e.g. top view of FIG. 1B), a shape of the first, second and third grooves 14, 16A and 16B may depend on electric potentials that may be applied to the first and second diepads 10A, 10B and the leads 12 during an operation of the semiconductor package 100. Since any of the first and second diepads 10A, 10B and the leads 12 may be configured to operate at different electric potentials, minimum creepage distances between any of these components may need to be provided. Accordingly, in the example of FIG. 1A to 1D, the first groove 14, the second groove 16A and the third groove 16B may form an H-shape. Here, each of the first groove 14, the second groove 16A and the third groove 16B may extend along an entire side of at least one of the first diepad 10A and the second diepad 10B.

When measured in the z-direction, a depth of a respective groove may depend on a required minimum creepage distance between electrically conductive parts separated by the groove. For example, depths of the first, second and third grooves 14, 16A and 16B may lie in a range from about 0.1 mm to about 5.0 mm, more particular from about 0.2 mm to about 2.0 mm. In one example, the first, second and third grooves 14, 16A and 16B may have identical depths. In a further example, a depth of the first groove 14 may differ from the depths of the second groove 16A and the third groove 16B. In the specific example of FIG. 1A to 1D, the depths of the second groove 16A and the third groove 16B may be smaller than the depth of the first groove 14.

In addition, when measured in the z-direction, the first, second and third grooves 14, 16A and 16B may have different depths compared to thicknesses of the first and second diepads 10A and 10B. In FIG. 1C, a depth of the first groove 14 may be substantially similar to thicknesses of the first diepad 10A and the second diepad 10B, while in FIG. 1D a depth of the second and third grooves 16A/16B may be smaller than a thickness of the first and second diepads 10A/10B. In the cross-sectional side views of FIGS. 1C and 1D, the first, second and third grooves 14, 16A and 16B may have an exemplary shape of a trapezoid. In further examples, the grooves 14, 16A and 16B may be shaped differently, for example circular, rectangular, quadratic, elliptic, etc.

Figure 2:
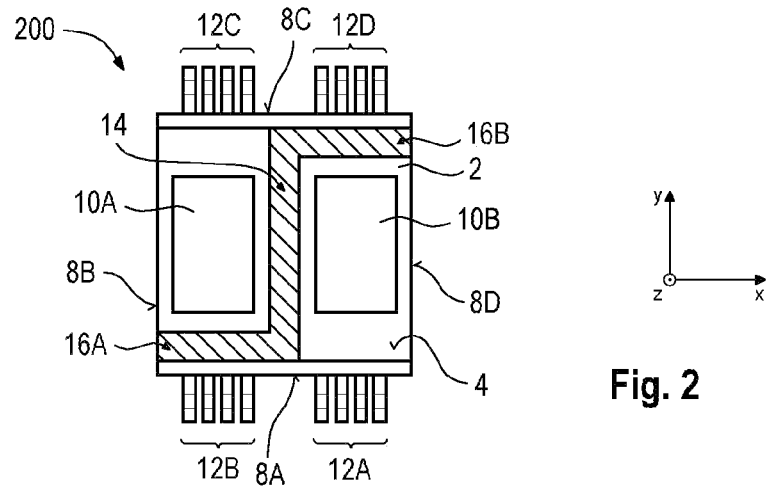
FIG. 2 schematically illustrates a top view of a semiconductor package in accordance with the disclosure.

The semiconductor package 200 of FIG. 2 may be at least partly similar to the semiconductor package 100 of FIGS. 1A to 1D. In the example of FIG. 2, the first groove 14, the second groove 16A and the third groove 16B may form an S-shape. Since the set of leads 12A and the second diepad 10B may be configured to operate at similar electric potentials, no minimum creepage distance and thus no groove may be required between these components. The same may hold true for the set of leads 12C and the first diepad 10A.

Figure 3:
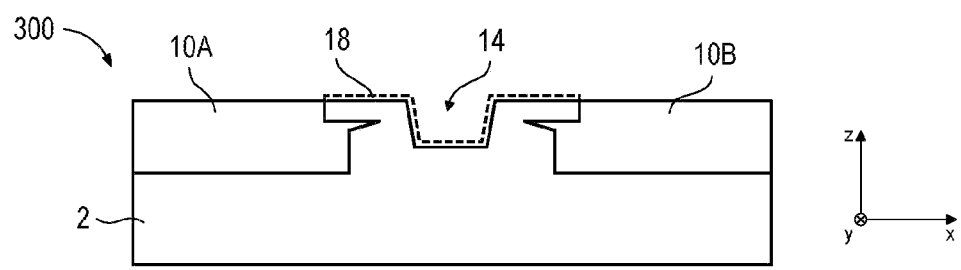
FIG. 3 schematically illustrates a cross-sectional side view of a semiconductor package in accordance with the disclosure.

The semiconductor package 300 of FIG. 3 may be at least partly similar to the semiconductor package 100 of FIG. 1A to 1D. Compared to FIG. 1C, a depth of the first groove 14 may be smaller than thicknesses of the first and second diepads 10A and 10B. This may result in a reduced creepage distance 18 between the first diepad 10A and the second diepad 10B as compared to the example of FIG. 1C. The depth of the first groove 14 may be reduced for the case of smaller values of the required minimum creepage distance.

Figure 4:
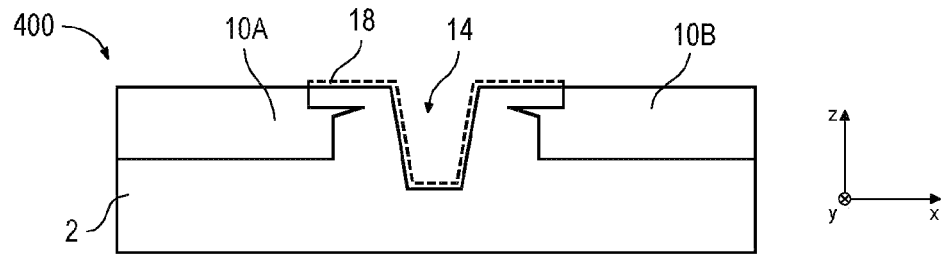
FIG. 4 schematically illustrates a cross-sectional side view of a semiconductor package in accordance with the disclosure.

The semiconductor package 400 of FIG. 4 may be at least partly similar to the semiconductor package 100 of FIG. 1A to 1D. Compared to FIG. 1C, a depth of the first groove 14 may be greater than thicknesses of the first and second diepads 10A and 10B. This may result in an increased creepage distance 18 between the first diepad 10A and the second diepad 10B as compared to the example of FIG. 1C. A depth of the first groove 14 may be increased for the case of higher values of the required minimum creepage distance.

Figure 5A:
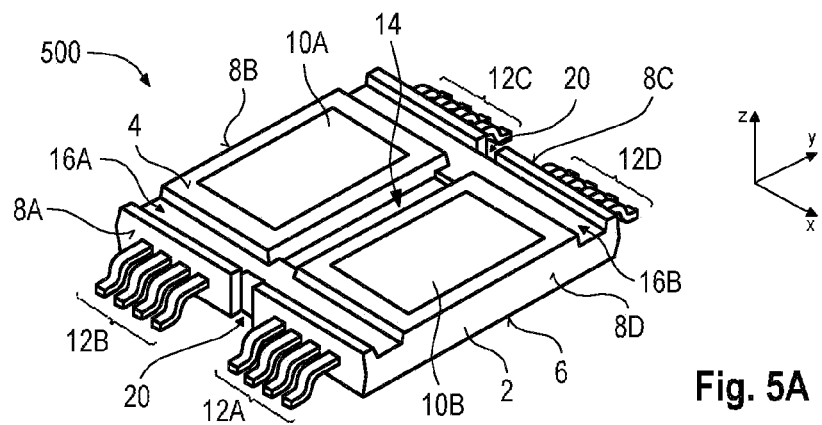
FIGS. 5A and 5B schematically illustrate a perspective view and a top view of a semiconductor package in accordance with the disclosure.
Figure 5B:
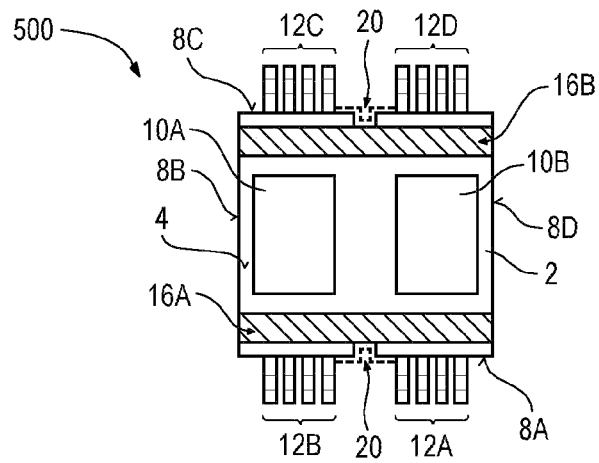

FIGS. 5A and 5B illustrate a perspective view and a top view of a semiconductor package 500 in accordance with the disclosure, respectively. The semiconductor package 500 of FIGS. 5A and 5B may be at least partly similar to the semiconductor package 100 of FIG. 1A to 1D. The semiconductor package 500 may include one or multiple fourth grooves 20 formed in one or multiple of the side surfaces 8A to 8D of the package body 2. Here, each of the fourth grooves 20 may be arranged between leads 12 protruding out of the package body 2. In the example of FIGS. 5A and 5B, a first one of the fourth grooves 20 may be arranged between the first set of leads 12A and the second set of leads 12B. In addition, a second one of the fourth grooves 20 may be arranged between the third set of leads 12C and the fourth set of leads 12D.

The leads 12 of the semiconductor package 500 may be configured to operate at different electric potentials. For example, leads of the second set of leads 12B may be connected to a source electrode of a power transistor, while leads of the first set of leads 12A may be connected to a drain electrode of a power transistor (see e.g. FIG. 12). Each of the fourth grooves 20 may be configured to increase a creepage distance along the package body 2 between leads 12 separated by the respective fourth groove 20 (see dashed lines).

Figure 6:
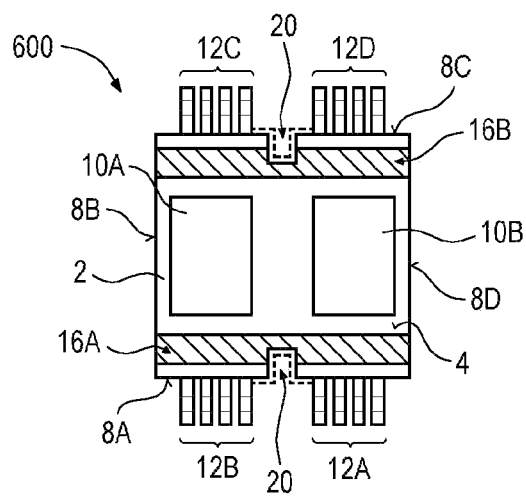
FIG. 6 schematically illustrates a top view of a semiconductor package in accordance with the disclosure.

The semiconductor package 600 of FIG. 6 may be at least partly similar to the semiconductor package 500 of FIGS. 5A and 5B. In the example of FIG. 6, a first one of the fourth grooves 20 may overlap with the second groove 16A, while a second one of the fourth grooves 20 may overlap with the third groove 16B. Due to the overlaps, creepage distances indicated by dashed lines may be increased as compared to FIGS. 5A and 5B such that a risk of shorts and malfunctions of the semiconductor package 600 may be decreased even further.

Figure 7:
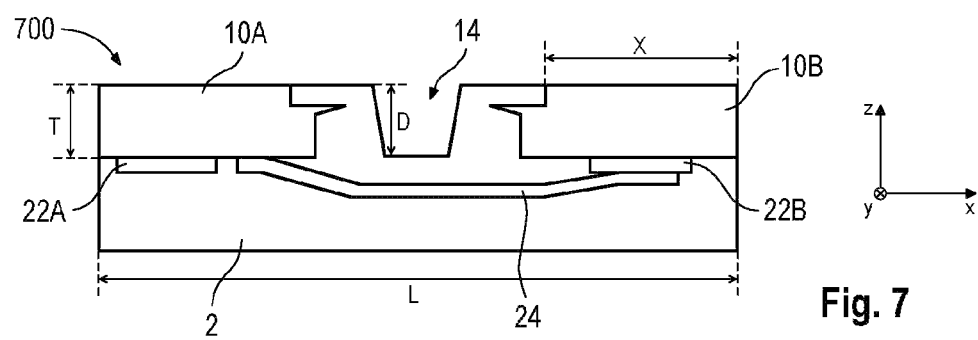
FIG. 7 schematically illustrates a cross-sectional side view of a semiconductor package in accordance with the disclosure.

The semiconductor package 700 of FIG. 7 may be at least partly similar to the semiconductor package 100 of FIG. 1A to 1D. In contrast to previously described figures, FIG. 7 explicitly shows the first semiconductor chip 22A and the second semiconductor chip 22B arranged on the first diepad 10A and the second diepad 10B, respectively. The semiconductor package 700 may include an electric connection element 24 encapsulated in the package body 2 and extending over the first groove 14 between the first diepad 10A and the second diepad 10B. For example, the electric connection element 24 may include at least one of a wire, a clip, a ribbon, etc. In the example of FIG. 7, the first semiconductor chip 22A and the second semiconductor chip 22B may be electrically connected via the first diepad 10A and the electric connection element 24. In particular, one end of the electric connection element 24 may be connected to a source electrode of the second semiconductor chip 22B, while the other end of the electric connection element 24 may be connected to the first diepad 10A which may be coupled to a drain electrode of the first semiconductor chip 22A (see e.g. FIG. 12).

In the example of FIG. 7, the first diepad 10A, the second diepad 10B and the leads 12 (not illustrated) may be parts of a dual gauge leadframe. When measured in the z-direction, a thickness of the leads 12 may be smaller than at least one of a thickness of the first diepad 10A and a thickness of the second diepad 10B. In one example of a dual gauge leadframe, a thickness of at least one of the first and second diepads 10A and 10B may be about 0.9 mm, while a thickness of the leads 12 may be about 0.5 mm or about 0.6 mm. In a further example, a thickness of at least one of the first and second diepads 10A, 10B may be about 1.27 mm, while a thickness of the leads 12 may be about 0.5 mm or about 0.6 mm. In yet a further example, a thickness of at least one of the first and second diepads 10A, 10B may be about 2.0 mm (or even above), while a thickness of the leads 12 may be about 0.5 mm or about 0.6 mm. In some examples, a lead thickness may be in a range from about 0.1 mm to about 0.2 mm.

When measured in the z-direction, a depth of the first groove 14 may be smaller than or equal to at least one of a thickness of the first diepad 10A and a thickness of the second diepad 10B. In the example of FIG. 7, the depth D of the first groove 14 may be substantially similar to the thicknesses T of both of the first and second diepads 10A and 10B. Due to such values of T and D, the electric connection element 24 may need to have only a short length in order to form the electric connection (such as e.g. a wire loop) over the first groove 14. In contrast to this, conventional arrangements with thinner diepads may require longer electric connection elements for bridging the first groove 14. A reduced length of the electric connection element 24 may provide an improved performance of the semiconductor package 700 by increasing a maximum current rating and/or by lowering inductance and resistance.

Figure 8:
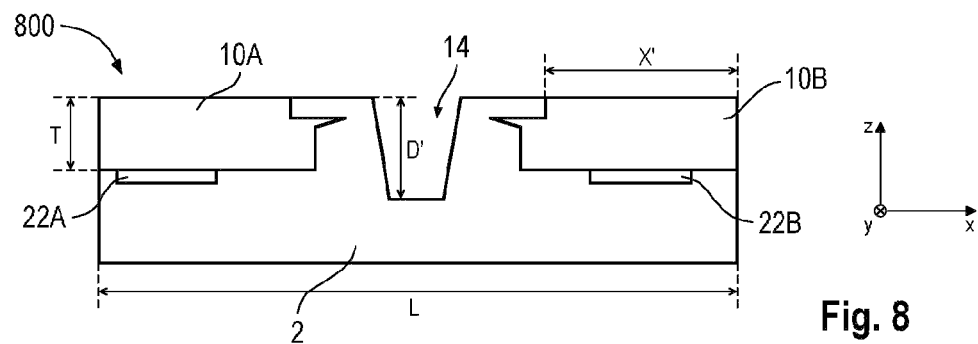
FIG. 8 schematically illustrates a cross-sectional side view of a semiconductor package in accordance with the disclosure.

The semiconductor package 800 of FIG. 8 may be at least partly similar to previously described semiconductor packages. A depth of the first groove 14 may be greater than at least one of a thickness of the first diepad 10A and a thickness of the second diepad 10B. In the example of FIG.

8, the depth D' of the first groove 14 may be greater than the thickness T of the first and second diepads 10A and 10B. The first groove 14 with an increased depth D' may allow for extending a dimension X' of the first and second diepads 10A and 10B in the x-direction towards the first groove 14, while still providing a required minimum creepage distance between the first and second diepads 10A and 10B. The increased dimension X' may result in an increased area of the first and second diepads 10A and 10B, thereby providing enhanced heat dissipation, for example towards a heat sink (not illustrated) which may be arranged over exposed surfaces of the first and second diepads 10A and 10B.

Figure 9:
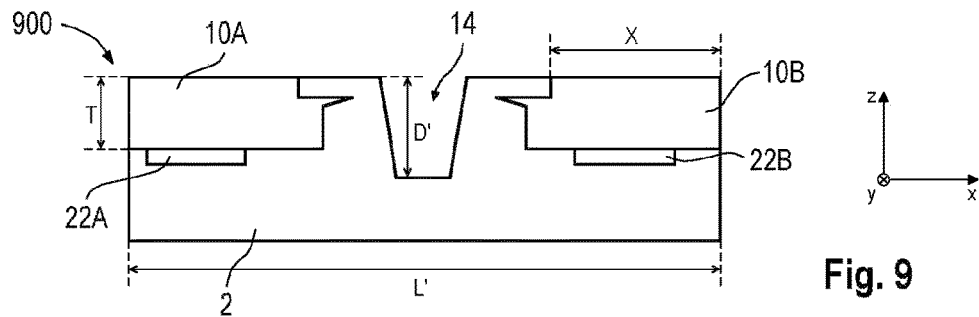
FIG. 9 schematically illustrates a cross-sectional side view of a semiconductor package in accordance with the disclosure.

The semiconductor package 900 of FIG. 9 may be at least partly similar to the semiconductor package 800 of FIG. 8. As explained in connection with FIG. 8, increasing the depth D' of the first groove 14 may provide an extension of the first and second diepads 10A and 10B towards the first groove 14, while still maintaining a required minimum creepage distance between the first and second diepads 10A and 10B. Arranging the first and second diepads 10A and 10B closer to the first groove 14 may allow for reducing a dimension L' of the semiconductor package 900 in the x-direction, while substantially maintaining the size of the first and second diepads 10A and 10B and thus providing a required heat dissipation.

Figure 10:
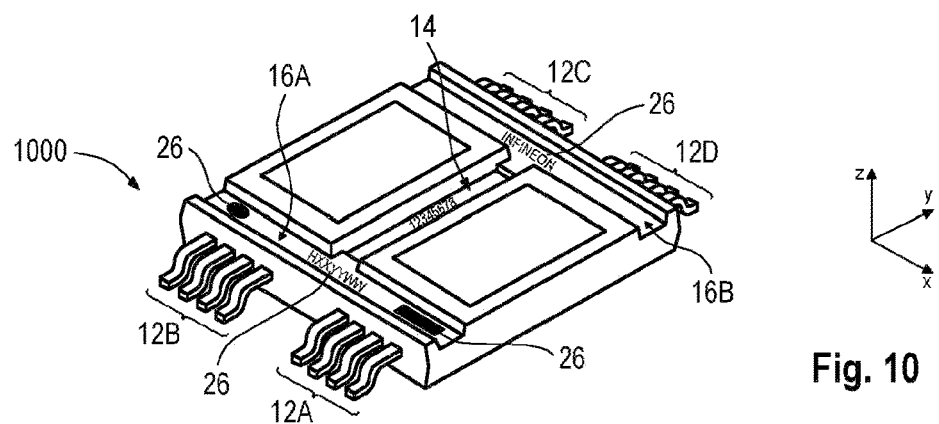
FIG. 10 schematically illustrates a perspective view of a semiconductor package in accordance with the disclosure.

The semiconductor package 1000 of FIG. 10 may be at least partly similar to the semiconductor package 100 of FIG. 1A to 1D. The semiconductor package 1000 may include one or multiple optical markings 26 which may be arranged on at least one of the first groove 14, the second groove 16A and the third groove 16B. Each of the first, second and third grooves 14, 16A and 16B may provide adequate and safe surfaces for arranging the optical markings 26. In one example, an optical marking 26 may correspond to or may include a laser marking. For example, an optical marking 26 may include at least one of geometric forms or images (such as e.g. rectangle, circle, ellipse, company logos, etc.), characters, numbers, etc. An optical marking 26 may e.g. include product-related information such as e.g. one or more of a lot or batch number, a production date, a company name, a data matrix code configured to provide secure single device traceability, etc. In the example of FIG. 10, the semiconductor package 1000 may include an exemplary number of five optical markings including a circle, a rectangle, and three character strings (see "HXXYYWW", "12345678", "INFINEON").

Figure 11:
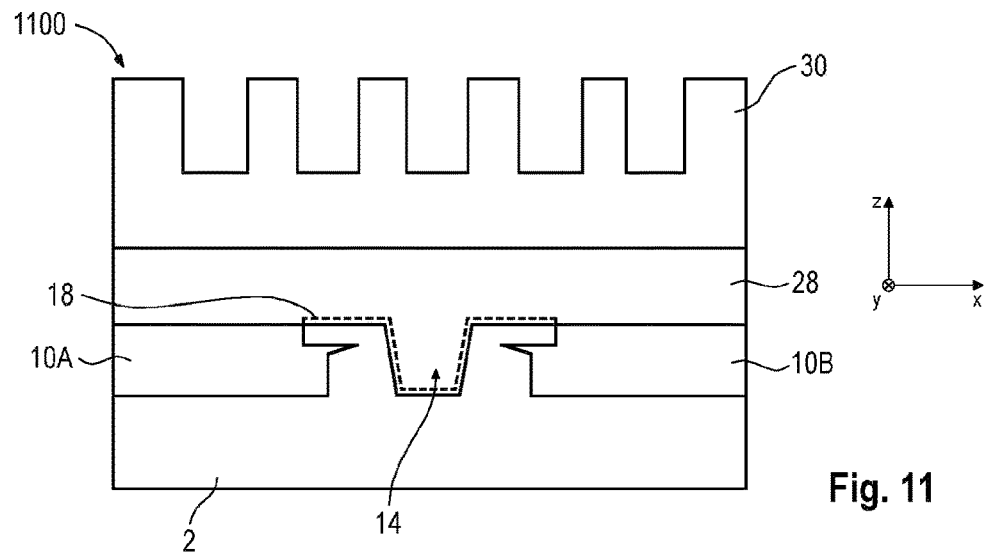
FIG. 11 schematically illustrates a cross-sectional side view of a semiconductor package in accordance with the disclosure.

The semiconductor package 1100 of FIG. 11 may be at least partly similar to the semiconductor package 100 of FIG. 1A to 1D. The semiconductor package 1100 may include an electrically insulating filler material 28 arranged over at least one of the first diepad 10A and the second diepad 10B. The electrically insulating filler material 28 may be arranged in at least one of the first groove 14, the second groove 16A and the third groove 16B. For the sake of simplicity, FIG. 11 only illustrates the electrically insulating filler material 28 being arranged in the first groove 14, while the further grooves of the arrangement are not shown. For example, the electrically insulating filler material 28 may include a polymer and/or a resin which may include ceramic fillers or not. Typically, the electrically insulating filler material 28 may correspond to or may include a thermal interface material (TIM), such as e.g. a silicone based gap filler.

The semiconductor package 1100 may further include a heat sink 30 arranged over the electrically insulating filler material 28. The heat sink 30 may be in thermal contact with at least one of the upper surfaces of the first diepad 10A and the second diepad 10B uncovered by the material of the package body 2. In the example of FIG. 11, the semiconductor package 1100 may correspond to a top-side cooled device. In conventional arrangements (not illustrated), a thermal foil may bridge the first groove 14, wherein a creepage distance between the diepads 10A and 10B may extend along the thermal foil. In contrast to this, the creepage distance 18 of FIG. 11 may extend all along the surface of the first groove 14 and may thus provide an increased length. A double isolation may be provided by isolating the heat sink 30 by means of a tape, in particular an adhesion tape. The material of the tape may include epoxy, in particular at least one of polyimide, silicone, etc. Such heat sink isolation layer may be tested before applying a gap filler in order to ensure the isolation property.

Figure 12:
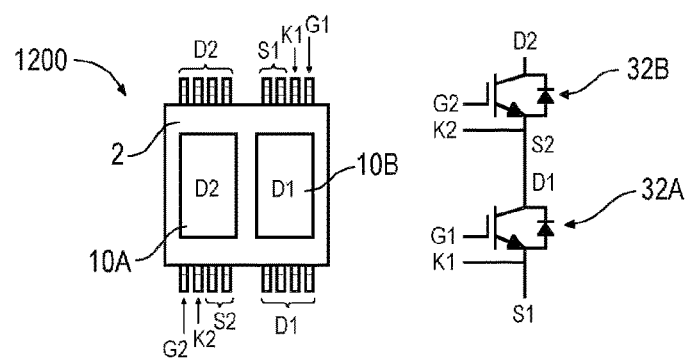
FIG. 12 schematically illustrates a top view of a semiconductor package 1200 in accordance with the disclosure and a diagram of a circuitry which may be implemented in the semiconductor package.

The left part of FIG. 12 illustrates a top view of a semiconductor package 1200 in accordance with the disclosure, while the right part of FIG. 12 illustrates a diagram of a circuitry which may be implemented in the semiconductor package 1200. For example, the semiconductor package 1200 may be at least partly similar to the semiconductor package 100 of FIG. 1A to 1D. A first semiconductor chip and a second semiconductor chip of the semiconductor package 1200 may include a first power transistor 32A and a second power transistor 32B, respectively, each including a gate, a source and a drain (see G1, S1, D1 and G2, S2, D2). Optionally, each of the first and second power transistors 32A and 32B may include a Kelvin connection (see K1 and K2). The first power transistor 32A and the second power transistor 32B may be connected in series and may form a low side switch and a high side switch of a half bridge circuit. The assignment of the leads and the exposed diepad surfaces of the semiconductor package 1200 to the individual electric contacts of the circuitry are indicated in the left part of FIG. 12.

Figure 13:
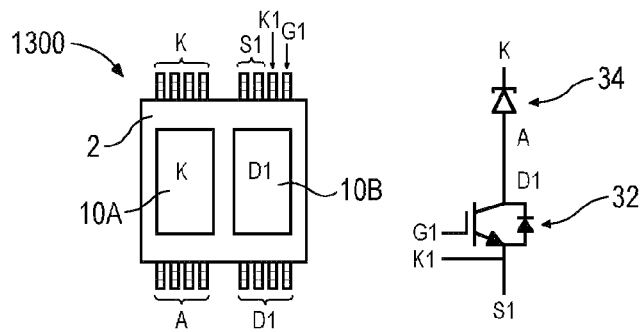
FIG. 13 schematically illustrates a top view of a semiconductor package 1300 in accordance with the disclosure and a diagram of a circuitry which may be implemented in the semiconductor package.

The left part of FIG. 13 illustrates a top view of a semiconductor package 1300 in accordance with the disclosure, while the right part of FIG. 13 illustrates a diagram of a circuitry which may be implemented in the semiconductor package 1300. For example, the semiconductor package 1300 may be at least partly similar to the semiconductor package 100 of FIG. 1A to 1D. The semiconductor package 1300 may include a first semiconductor chip having a power transistor 32 with a gate, a source and a drain (see G1, S1, D1) as well as a second semiconductor chip having a power diode 34 with an anode and a cathode (see A and K). Each of the power transistor 32 and the power diode 34 may form a part of a boost configuration. The assignment of the leads and the exposed diepad surfaces of the semiconductor package 1300 to the individual electric contacts of the circuitry are indicated in the left part of FIG. 13. It is noted that the exemplary applications of FIGS. 12 and 13 are non-exhaustive. Further applications may include or may be based on two diodes, or an IGBT and a diode on one chip carrier, or a CoolMOS, or a GaN component, etc.

Figure 14:
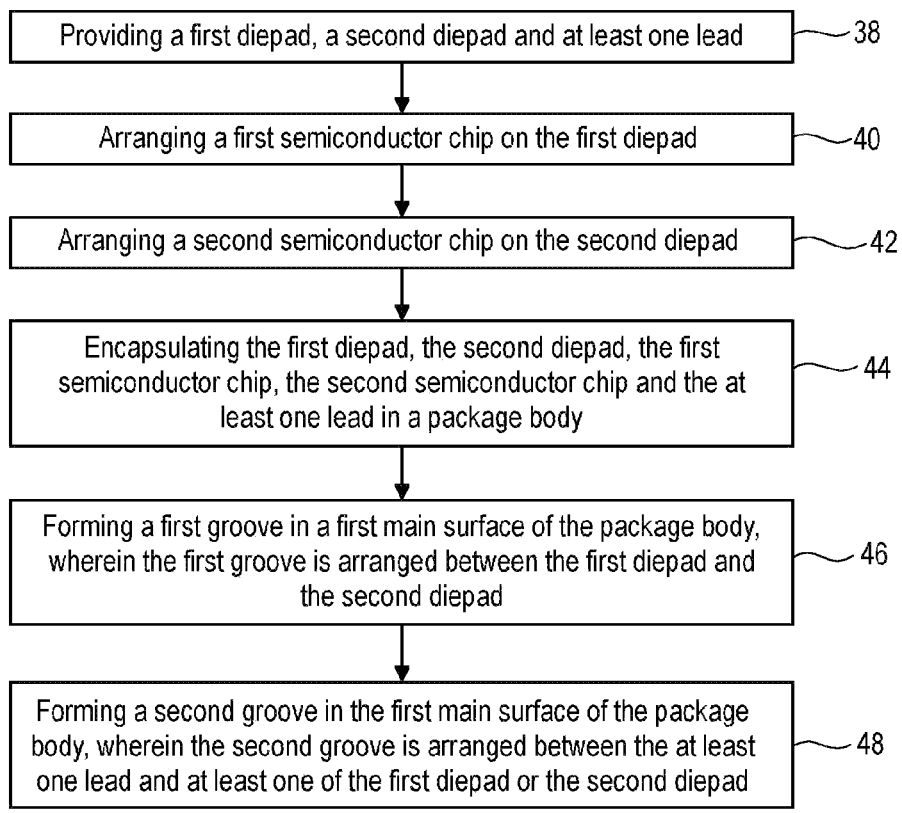
FIG. 14 illustrates a flowchart of a method for manufacturing a semiconductor package in accordance with the disclosure.

FIG. 14 illustrates a flowchart of a method for manufacturing a semiconductor package in accordance with the disclosure. The method is described in a general manner in order to qualitatively specify aspects of the disclosure and may include further aspects. The method may be extended by any of the aspects described in connection with other examples in accordance with the disclosure. The method may be used for manufacturing any of the semiconductor packages in accordance with the disclosure described herein.

At 38, a first diepad, a second diepad and at least one lead may be provided. At 40, a first semiconductor chip may be arranged on the first diepad. At 42, a second semiconductor chip may be arranged on the second diepad. At 44, the first diepad, the second diepad, the first semiconductor chip, the second semiconductor chip and the at least one lead may be encapsulated in a package body. The package body may include a first main surface, a second main surface opposite to the first main surface, and a side surface extending between the two main surfaces. The first diepad may be uncovered by the package body at the first main surface. The second diepad may be uncovered by the package body at the first main surface. The at least one lead may protrude out of the package body at the side surface. At 46, a first groove may be formed in the first main surface, wherein the first groove may be arranged between the first diepad and the second diepad. At 48, a second groove may be formed in the first main surface, wherein the second groove may be arranged between the at least one lead and at least one of the first diepad and the second diepad. In one example, the first groove and the second groove may be separated from each other. In further examples, the first groove and the second groove may be connected or continuous. Here, the grooves may merge into each other. Continuous grooves may provide easier gap filler dispensing in which, for example, only one dot of a gap filler may be required. In addition, continuous grooves may provide a better gap filler material flow behavior.

EXAMPLES

In the following, semiconductor packages and methods for manufacturing semiconductor packages will be explained by means of examples.

Example 1 is a semiconductor package, comprising: a package body, comprising a first main surface, a second main surface opposite to the first main surface, and a side surface extending between the first and second main surfaces; a first diepad encapsulated in the package body, wherein the first diepad is at least partially uncovered by the package body at the first main surface; a second diepad encapsulated in the package body, wherein the second diepad is at least partially uncovered by the package body at the first main surface; a first semiconductor chip encapsulated in the package body and arranged on the first diepad; a second semiconductor chip encapsulated in the package body and arranged on the second diepad; at least one lead encapsulated in the package body and protruding out of the package body at the side surface; a first groove formed in the first main surface, wherein the first groove is arranged between the first diepad and the second diepad; and a second groove formed in the first main surface, wherein the second groove is arranged between the at least one lead and at least one of the first diepad and the second diepad.

Example 2 is a semiconductor package according to Example 1, wherein: the first diepad and the second diepad are configured to operate at different electric potentials, and the at least one lead and at least one of the first diepad and the second diepad are configured to operate at different electric potentials.

Example 3 is a semiconductor package according to Example 1 or 2, wherein: the first groove is configured to increase a creepage distance along the package body between the first diepad and the second diepad, and the second groove is configured to increase a creepage distance along the package body between the at least one lead and at least one of the first diepad and the second diepad.

Example 4 is a semiconductor package according to one of the preceding Examples, wherein: the first diepad, the second diepad and the at least one lead are part of a dual gauge leadframe, and a thickness of the at least one lead is smaller than at least one of a thickness of the first diepad and a thickness of the second diepad.

Example 5 is a semiconductor package according to one of the preceding Examples, further comprising: an electric connection element encapsulated in the package body and extending over the first groove between the first diepad and the second diepad, wherein a depth of the first groove is smaller than or equal to at least one of a thickness of the first diepad and a thickness of the second diepad.

Example 6 is a semiconductor package according to one of Examples 1 to 4, wherein a depth of the first groove is greater than at least one of a thickness of the first diepad and a thickness of the second diepad.

Example 7 is a semiconductor package according to one of the preceding Examples, wherein a depth of the second groove is smaller than a depth of the first groove.

Example 8 is a semiconductor package according to one of the preceding Examples, wherein at least one of a depth of the first groove or a depth of the second groove is in a range from 0.1 mm to 5.0 mm.

Example 9 is a semiconductor package according to one of the preceding Examples, wherein each of the first groove and the second groove extends along an entire side of at least one of the first diepad and the second diepad.

Example 10 is a semiconductor package according to one of the preceding Examples, further comprising: at least one further lead encapsulated in the package body and protruding out of the package body at a further side surface of the package body, and a third groove formed in the first main surface, wherein the third groove is arranged between the at least one further lead and at least one of the first diepad and the second diepad.

Example 11 is a semiconductor package according to Example 10, wherein the first groove, the second groove and the third groove form an S-shape or an H-shape.

Example 12 is a semiconductor package according to one of the preceding Examples, further comprising: a fourth groove formed in the side surface of the package body, wherein the fourth groove is arranged between a first lead and a second lead of the at least one lead.

Example 13 is a semiconductor package according to Example 12, wherein the fourth groove overlaps with the second groove.

Example 14 is a semiconductor package according to one of the preceding Examples, wherein each of the first semiconductor chip and the second semiconductor chip comprises a power semiconductor.

Example 15 is a semiconductor package according to one of the preceding Examples, wherein: the first semiconductor chip comprises a first power transistor forming a low side switch of a half bridge circuit, and the second semiconductor chip comprises a second power transistor connected in series with the first power transistor and forming a high side switch of the half bridge circuit.

Example 16 is a semiconductor package according to one of Examples 1 to 15, wherein: the first semiconductor chip comprises a power transistor forming a part of a boost configuration, and the second semiconductor chip comprises a power diode connected in series with the power transistor and forming a part of the boost configuration.

Example 17 is a semiconductor package according to one of the preceding Examples, further comprising: a heat sink arranged over the first main surface, wherein the heat sink is in thermal contact with at least one of the uncovered parts of the first diepad and the second diepad.

Example 18 is a semiconductor package according to Example 17, further comprising: an electrically insulating filler material arranged between the heat sink and at least one of the first diepad and the second diepad, wherein the filler material is arranged in at least one of the first groove and the second groove.

Example 19 is a semiconductor package according to one of the preceding Examples, further comprising: an optical marking arranged on at least one of the first groove and the second groove.

Example 20 is a semiconductor package, comprising: a package body, comprising a first main surface, a second main surface opposite to the first main surface, and a side surface extending between the two main surfaces; a first diepad encapsulated in the package body, wherein the first diepad is at least partially uncovered by the package body at the first main surface; a second diepad encapsulated in the package body, wherein the second diepad is at least partially uncovered by the package body at the first main surface; a first semiconductor chip encapsulated in the package body and arranged on the first diepad; a second semiconductor chip encapsulated in the package body and arranged on the second diepad; a first groove formed in the first main surface, wherein the first groove is arranged between the first diepad and the second diepad; and an electric connection element encapsulated in the package body and extending over the first groove between the first diepad and the second diepad, wherein a depth of the first groove is smaller than or equal to at least one of a thickness of the first diepad or a thickness of the second diepad.

Example 21 is a method for manufacturing a semiconductor package, the method comprising: providing a first diepad, a second diepad and at least one lead; arranging a first semiconductor chip on the first diepad; arranging a second semiconductor chip on the second diepad; encapsulating the first diepad, the second diepad, the first semiconductor chip, the second semiconductor chip and the at least one lead in a package body, wherein the package body comprises a first main surface, a second main surface opposite to the first main surface, and a side surface extending between the two main surfaces, wherein: the first diepad is at least partially uncovered by the package body at the first main surface, the second diepad is at least partially uncovered by the package body at the first main surface, and the at least one lead protrudes out of the package body at the side surface; forming a first groove in the first main surface, wherein the first groove is arranged between the first diepad and the second diepad; and forming a second groove in the first main surface, wherein the second groove is arranged between the at least one lead and at least one of the first diepad and the second diepad.

As employed in this specification, the terms "connected", "coupled", "electrically connected", and/or "electrically coupled" may not necessarily mean that elements must be directly connected or coupled together. Intervening elements may be provided between the "connected", "coupled", "electrically connected", or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or multiple additional layers being arranged between the implied surface and the material layer.

Furthermore, to the extent that the terms "having", "containing", "including", "with", or variants thereof are used in either the detailed description or the claims, such terms are intended to be inclusive in a manner similar to the term "comprising". That is, as used herein, the terms "having", "containing", "including", "with", "comprising", and the like are open-ended terms that indicate the presence of stated elements or features, but do not preclude additional elements or features. The articles "a", "an", and "the" are intended to include the plural as well as the singular, unless the context clearly indicates otherwise.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or multiple" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures.

Although the disclosure has been shown and described with respect to one or multiple implementations, equivalent alterations and modifications will occur to others skilled in the art based at least in part upon a reading and understanding of this specification and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or multiple other features of the other implementations as may be desired and advantageous for any given or particular application.

The invention claimed is:

1. A semiconductor package, comprising:
   a package body, comprising a first main surface, a second main surface opposite to the first main surface, and a side surface extending between the first and second main surfaces;

a first diepad encapsulated in the package body, wherein the first diepad is at least partially uncovered by the package body at the first main surface;

a second diepad encapsulated in the package body, wherein the second diepad is at least partially uncovered by the package body at the first main surface;

a first semiconductor chip encapsulated in the package body and arranged on the first diepad;

a second semiconductor chip encapsulated in the package body and arranged on the second diepad;

at least one lead encapsulated in the package body and protruding out of the package body at the side surface;

a first groove formed in the first main surface, wherein the first groove is arranged between the first diepad and the second diepad; and a second groove formed in the first main surface, wherein the second groove is arranged between the at least one lead and at least one of the first diepad and the second diepad.

2. The semiconductor package of claim 1, wherein:
the first diepad and the second diepad are configured to operate at different electric potentials, and
the at least one lead and at least one of the first diepad or the second diepad are configured to operate at different electric potentials.

3. The semiconductor package of claim 1, wherein:
the first groove is configured to increase a creepage distance along the package body between the first diepad and the second diepad, and
the second groove is configured to increase a creepage distance along the package body between the at least one lead and at least one of the first diepad and the second diepad.

4. The semiconductor package of claim 1, wherein:
the first diepad, the second diepad and the at least one lead are part of a dual gauge leadframe, and
a thickness of the at least one lead is smaller than at least one of a thickness of the first diepad and a thickness of the second diepad.

5. The semiconductor package of claim 1, further comprising:
an electric connection element encapsulated in the package body and extending over the first groove between the first diepad and the second diepad, wherein a depth of the first groove is smaller than or equal to at least one of a thickness of the first diepad and a thickness of the second diepad.

6. The semiconductor package of claim 1, wherein a depth of the first groove is greater than at least one of a thickness of the first diepad and a thickness of the second diepad.

7. The semiconductor package of claim 1, wherein a depth of the second groove is smaller than a depth of the first groove.

8. The semiconductor package of claim 1, wherein at least one of a depth of the first groove and a depth of the second groove is in a range from 0.1 mm to 5.0 mm.

9. The semiconductor package of claim 1, wherein each of the first groove and the second groove extends along an entire side of at least one of the first diepad and the second diepad.

10. The semiconductor package of claim 1, further comprising:
at least one further lead encapsulated in the package body and protruding out of the package body at a further side surface of the package body, and a third groove formed in the first main surface, wherein the third groove is arranged between the at least one further lead and at least one of the first diepad and the second diepad.

11. The semiconductor package of claim 10, wherein the first groove, the second groove and the third groove form an S-shape or an H-shape.

12. The semiconductor package of claim 1, further comprising:
a fourth groove formed in the side surface of the package body, wherein the fourth groove is arranged between a first lead and a second lead of the at least one lead.

13. The semiconductor package of claim 12, wherein the fourth groove overlaps with the second groove.

14. The semiconductor package of claim 1, wherein each of the first semiconductor chip and the second semiconductor chip comprises a power semiconductor.

15. The semiconductor package of claim 1, wherein:
the first semiconductor chip comprises a first power transistor forming a low side switch of a half bridge circuit, and
the second semiconductor chip comprises a second power transistor connected in series with the first power transistor and forming a high side switch of the half bridge circuit.

16. The semiconductor package of claim 1, wherein:
the first semiconductor chip comprises a power transistor forming a part of a boost configuration, and
the second semiconductor chip comprises a power diode connected in series with the power transistor and forming a part of the boost configuration.

17. The semiconductor package of claim 1, further comprising:
a heat sink arranged over the first main surface, wherein the heat sink is in thermal contact with at least one of the uncovered parts of the first diepad and the second diepad.

18. The semiconductor package of claim 17, further comprising:
an electrically insulating filler material arranged between the heat sink and at least one of the first diepad or the second diepad, wherein the filler material is arranged in at least one of the first groove and the second groove.

19. The semiconductor package of claim 1, further comprising:
an optical marking arranged on at least one of the first groove or the second groove.

20. A semiconductor package, comprising:
a package body, comprising a first main surface, a second main surface opposite to the first main surface, and a side surface extending between the two main surfaces;
a first diepad encapsulated in the package body, wherein the first diepad is at least partially uncovered by the package body at the first main surface;
a second diepad encapsulated in the package body, wherein the second diepad is at least partially uncovered by the package body at the first main surface;
a first semiconductor chip encapsulated in the package body and arranged on the first diepad;
a second semiconductor chip encapsulated in the package body and arranged on the second diepad;
a first groove formed in the first main surface, wherein the first groove is arranged between the first diepad and the second diepad; and
an electric connection element encapsulated in the package body and extending over the first groove between the first diepad and the second diepad, wherein a depth of the first groove is smaller than or equal to at least one of a thickness of the first diepad and a thickness of the second diepad.

\* \* \* \* \*